(12) United States Patent
Li

(10) Patent No.: US 7,344,934 B2
(45) Date of Patent: Mar. 18, 2008

(54) CMOS TRANSISTOR AND METHOD OF MANUFACTURE THEREOF

(75) Inventor: Hong-Jyh Li, Austin, TX (US)

(73) Assignee: Infineon Technologies AG, Munich (DE)

( * ) Notice: Subject to any disclaimer, the term of this patent is extended or adjusted under 35 U.S.C. 154(b) by 184 days.

(21) Appl. No.: 11/005,292

(22) Filed: Dec. 6, 2004

(65) Prior Publication Data

US 2006/0118879 A1    Jun. 8, 2006

(51) Int. Cl.
*H01L 21/8238* (2006.01)
(52) U.S. Cl. ............ 438/199; 438/197; 438/275; 438/287; 438/289; 257/E21.632; 257/E21.636
(58) Field of Classification Search .............. None
See application file for complete search history.

(56) References Cited

U.S. PATENT DOCUMENTS

| | | | |
|---|---|---|---|
| 4,432,035 A | 2/1984 | Hsieh et al. | |
| 4,990,974 A | 2/1991 | Vinal | |
| 5,041,885 A | 8/1991 | Gualandris et al. | |
| 5,066,995 A | 11/1991 | Young et al. | |
| 5,162,263 A | 11/1992 | Kunishima et al. | |
| 5,321,287 A | 6/1994 | Uemura et al. | |
| 5,763,922 A | 6/1998 | Chau | |
| 5,994,747 A | 11/1999 | Wu | |
| 6,020,243 A | 2/2000 | Wallace et al. | |
| 6,027,961 A | 2/2000 | Maiti et al. | |
| 6,048,769 A | 4/2000 | Chau | |
| 6,084,280 A | 7/2000 | Gardner et al. | |
| 6,124,171 A | 9/2000 | Arghavani et al. | |
| 6,159,782 A | 12/2000 | Xiang et al. | |
| 6,184,072 B1 | 2/2001 | Kaushik et al. | |
| 6,225,163 B1 | 5/2001 | Bergemont | |
| 6,291,867 B1 | 9/2001 | Wallace et al. | |

(Continued)

FOREIGN PATENT DOCUMENTS

EP    1 388 889 A2    2/2004

(Continued)

OTHER PUBLICATIONS

Hobbs, C., et al., "Fermi Level Pinning at the PolySi/Metal Oxide Interface," 2003 Symposium on VLSI Technology Digest of Technical Papers, Jun. 2003, 2 pages.

(Continued)

*Primary Examiner*—Michael Lebentritt
*Assistant Examiner*—Kyoung Lee
(74) *Attorney, Agent, or Firm*—Slater & Matsil, L.L.P.

(57) ABSTRACT

A CMOS device with transistors having different gate dielectric materials and a method of manufacture thereof. An aluminum-based material is used as a gate dielectric material of a PMOS device, and a hafnium-based material is used as a gate dielectric material of an NMOS device. A thin layer of silicon a few monolayers or a sub-monolayer thick is formed over the gate dielectric materials, before forming the gates. The thin layer of silicon bonds with the gate dielectric material and pins the work function of the transistors. A gate material that may comprise a metal in one embodiment is deposited over the thin layer of silicon. A CMOS device having a symmetric $V_t$ for the PMOS and NMOS FETs is formed.

33 Claims, 7 Drawing Sheets

U.S. PATENT DOCUMENTS

| | | |
|---|---|---|
| 6,348,390 B1 | 2/2002 | Wu |
| 6,410,967 B1 | 6/2002 | Hause et al. |
| 6,444,555 B2 | 9/2002 | Ibok |
| 6,475,908 B1 | 11/2002 | Lin et al. |
| 6,492,217 B1 | 12/2002 | Bai et al. |
| 6,528,858 B1 | 3/2003 | Yu et al. |
| 6,656,764 B1 | 12/2003 | Wang et al. |
| 6,716,685 B2 | 4/2004 | Lahaug |
| 6,720,221 B1 | 4/2004 | Ahn et al. |
| 6,740,944 B1 | 5/2004 | McElheny et al. |
| 6,852,645 B2 | 2/2005 | Colombo et al. |
| 6,897,095 B1 * | 5/2005 | Adetutu et al. ............ 438/119 |
| 6,921,691 B1 | 7/2005 | Li et al. |
| 2002/0005556 A1 | 1/2002 | Cartier et al. |
| 2002/0135030 A1 | 9/2002 | Horikawa |
| 2002/0135048 A1 | 9/2002 | Ahn et al. |
| 2002/0151125 A1 | 10/2002 | Kim et al. |
| 2002/0153573 A1 | 10/2002 | Mogami |
| 2003/0057432 A1 | 3/2003 | Gardner et al. |
| 2003/0104663 A1 | 6/2003 | Visokay et al. |
| 2003/0116804 A1 | 6/2003 | Visokay et al. |
| 2003/0137017 A1 | 7/2003 | Hisamoto et al. |
| 2003/0141560 A1 * | 7/2003 | Sun ........................ 257/410 |
| 2003/0219953 A1 | 11/2003 | Mayuzumi |
| 2004/0000695 A1 | 1/2004 | Matsuo |
| 2004/0005749 A1 | 1/2004 | Choi et al. |
| 2004/0009675 A1 | 1/2004 | Eissa et al. |
| 2004/0023462 A1 | 2/2004 | Rotondaro et al. |
| 2004/0132271 A1 | 7/2004 | Ang et al. |
| 2004/0217429 A1 | 11/2004 | Lin et al. |
| 2005/0035345 A1 | 2/2005 | Lin et al. |
| 2005/0064663 A1 | 3/2005 | Saito |
| 2005/0098839 A1 | 5/2005 | Lee et al. |
| 2005/0101159 A1 | 5/2005 | Droopad |
| 2005/0139926 A1 | 6/2005 | Shimizu et al. |
| 2005/0224897 A1 | 10/2005 | Chen et al. |
| 2005/0245019 A1 | 11/2005 | Luo et al. |
| 2005/0280104 A1 | 12/2005 | Li |
| 2006/0003507 A1 | 1/2006 | Jung et al. |
| 2006/0017112 A1 | 1/2006 | Wang et al. |
| 2006/0038236 A1 | 2/2006 | Yamamoto |

FOREIGN PATENT DOCUMENTS

| | | |
|---|---|---|
| EP | 1 531 496 A2 | 5/2005 |
| JP | 2002118175 | 4/2002 |
| JP | 2004289061 | 10/2004 |
| WO | WO 01/66832 A2 | 9/2001 |
| WO | WO 2004/095556 A1 | 11/2004 |
| WO | WO 2005/114718 A1 | 2/2005 |
| WO | WO 2006/061371 A1 | 6/2006 |
| WO | WO 2006/067107 A1 | 6/2006 |

OTHER PUBLICATIONS

Samavedam, S.B., et al., "Fermi Level Pinning with Sub-Monolayer MeOx and Metal Gates," IEEE, Mar. 2003, 4 pages.

"Front End Processes," International Technology Roadmap for Semiconductor (ITRS), 2002 Update, pp. 45-62, http://member.itrs.net/.

"High$_k$ Dielectric Materials," Tutorial: Materials for Thin Films / Microelectronics, pp. 1-3, Sigma-Aldrich Co., St. Lois, Missouri, US, http://www.sigmaaldrich.com/Area_of_Interest/Organic_Inorganic_Chemistry/Materials_Science/Thin_Films_Microelectronics/Tutorial/Dielectric_Materials.html, downloaded Jun. 9, 2004.

Guha, S., et al., "Atomic Beam Deposition of Lanthanum- and Yttrium-Based Oxide Thin Films for Gate Dielectrics," Applied Physics Letters, Oct. 23, 2000, vol. 77, No. 17, pp. 2710-2712, American Institute of Physics.

Muller, R.S., et al., "Device Electronics for Integrated Circuits," Second Ed., 1986, pp. 380-385, 398-399, John Wiley & Sons, New York, NY.

Wolf, S., "Silicon Processing for the VLSI Era: vol. II—CMOS Process Integration," 1990, pp. 432-441, Lattice Press, Sunset Beach, CA.

"Front End Processes," The International Technology Roadmap for Semiconductors: 2003 Edition, pp. 23-25, http://member.itrs.net/.

Gannavaram, S., et al., "Low Temperature ($\leq 800°$ C.) Recessed Junction Selective Silicon-Germanium Source/Drain Technology for sub-70 nm CMOS," 2000, 4 pp., IEEE, Los Alamitos, CA.

Huang, F.-J., et al., "Schottky-Clamped NMOS Transistors Implemented in a Conventional 0.8-µm CMOS Process," IEEE Electron Device Letters, Sep. 1998, pp. 326-328, vol. 19, No. 9, IEEE, Los Alamitos, CA.

Park, D.-G., et al., "Thermally Robust Dual-Work Function ALD-MN$_x$ MOSFETS using Conventional CMOS Process Flow," 2004 Symposium on VLSI Technology Digest of Technical Papers, 2004, pp. 186-187, IEEE, Los Alamitos, CA.

Lin, R., et al., "An Adjustable Work Function Technology Using Mo Gate for CMOS Devices," IEEE Electron Device Letters, Jan. 2002, pp. 49-51, vol. 23, No. 1, IEEE, Los Alamitos, CA.

Wakabayashi, H., et al., "A Dual-Metal Gate CMOS Technology Using Nitrogen-Concentration-Controlled TiNx Film," IEEE Transactions on Electron Devices, Oct. 2001, pp. 2363-2369, vol. 48, No. 10, IEEE, Los Alamitos, CA.

Hobbs, C.C., et al., "Fermi-Level Pinning at the Polysilicon/Metal Oxide Interface—Part I," IEEE Transactions on Electron Devices, vol. 51, No. 6, Jun. 2004, pp. 971-977.

* cited by examiner

CMOS TRANSISTOR AND METHOD OF MANUFACTURE THEREOF

CROSS-REFERENCE TO RELATED APPLICATIONS

This application relates to the following co-pending and commonly assigned patent application: Ser. No. 10/870,616, filed on Jun. 17, 2004, entitled, "CMOS Transistor With Dual High-k Gate Dielectric and Method of Manufacture Thereof," which application is hereby incorporated herein by reference.

TECHNICAL FIELD

The present invention relates generally to semiconductor devices, and more particularly to structures and methods of manufacturing complimentary metal oxide semiconductor (CMOS) transistor devices.

BACKGROUND

Semiconductor devices are used in a variety of electronic applications, such as personal computers, cell phones, digital cameras, and other electronic equipment, as examples. Semiconductor devices are typically fabricated by sequentially depositing insulating (or dielectric) layers, conductive layers, and semiconductive layers of material over a semiconductor substrate, and patterning the various layers using lithography to form circuit components and elements thereon.

A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET).

Early MOSFET processes used one type of doping to create either positive or negative channel transistors. More recent designs, referred to as complimentary MOS (CMOS) devices, use both positive and negative channel devices in complimentary configurations. While this requires more manufacturing steps and more transistors, CMOS devices are advantageous because they utilize less power, and the devices may be made smaller and faster.

The gate dielectric for MOSFET devices has in the past typically comprised silicon dioxide, which has a dielectric constant of about 3.9. However, as devices are scaled down in size, using silicon dioxide for a gate dielectric becomes a problem because of gate leakage current, which can degrade device performance. Therefore, there is a trend in the industry towards the development of the use of high dielectric constant (k) materials for use as the gate dielectric in MOSFET devices. The term "high k materials" as used herein refers to a dielectric material having a dielectric constant of about 4.0 or greater.

High k gate dielectric development has been identified as one of the future challenges in the 2002 edition of International Technology Roadmap for Semiconductors (ITRS), incorporated herein by reference, which identifies the technological challenges and needs facing the semiconductor industry over the next 15 years. For low power logic (for portable electronic applications, for example), it is important to use devices having low leakage current, in order to extend battery life. Gate leakage current must be controlled in low power applications, as well as sub-threshold leakage, junction leakage, and band-to-band tunneling.

To fully realize the benefits of transistor scaling, the gate oxide thickness needs to be scaled down to less than 2 nm. However, the resulting gate leakage current makes the use of such thin oxides impractical in many device applications where low standby power consumption is required. For this reason, the gate oxide dielectric material will eventually be replaced by an alternative dielectric material that has a higher dielectric constant. However, device performance using high k dielectric materials tends to suffer from trapped charge in the dielectric layer, which deteriorates the mobility, making the drive current lower than in transistors having silicon dioxide gate oxides, thus reducing the speed and performance of transistors having high k gate dielectric materials.

Another problem with using a high-k dielectric material as the gate electrode of a CMOS transistor is referred to in the art as a "Fermi-pinning" effect, which occurs at the interface of the gate electrode and gate dielectric material. Fermi-pinning is a problem that occurs in CMOS devices having both poly-silicon and metal gates. The Fermi-pinning effect causes a threshold voltage shift due to the increased charge caused by the Fermi-pinning effect. Fermi-pinning causes an asymmetric turn-on threshold voltage $V_t$ for the two transistors of a CMOS device, which is undesirable.

In prior art CMOS transistor designs, the gate dielectric material used for the CMOS transistor was typically $SiO_2$ or SiON and the gate electrode comprises polysilicon. A symmetric threshold voltage $V_t$ for the PMOS device and the NMOS device of a prior art CMOS device was easily achievable using $SiO_2$ or SiON as a gate dielectric material. For the PMOS device, the gate electrode was P-type, which was typically achieved by using polysilicon doped with boron (B) as the PMOS gate electrode material, as examples. For the NMOS device, the gate electrode was N-type, which was typically achieved by using polysilicon doped with phosphorous (P) as the NMOS gate electrode material, as examples.

However, when attempts are made to use hafnium-based dielectric materials, a high k dielectric material, for the gate dielectric material of a CMOS device, problems arise. For the NMOS device, polysilicon doped with P may be used as the material for the gate electrode, and an N-type gate is achievable, which is desired. However, for the PMOS device, if polysilicon doped with B, for example, is used for the gate electrode material, the hafnium-based gate electrode material interacts with adjacent materials, caused by Fermi-pinning, resulting in an N-type gate, which is ineffective for the PMOS device. An N-type gate on the PMOS transistor is undesirable: the PMOS device gate should be P-type to optimize the CMOS device performance and achieve a symmetric $V_{tp}$ and $V_{tn}$. Thus, a CMOS device having an N-type gate electrode for the PMOS transistor has an asymmetric $V_{tn}$ and $V_{tp}$, due to the Fermi-pinning effect of the high k dielectric material. Efforts have been made to improve the quality of high-k dielectric films and resolve the Fermi-pinning problems, but the efforts have resulted in little success.

In electronics, the "work function" is the energy (usually measured in electron volts) needed to remove an electron from the Fermi level to a point an infinite distance away outside the surface. Work function is a material property of any material, whether the material is a conductor, semiconductor, or dielectric. The work function of a metal is fixed and cannot be changed unless the material composition is changed, for example. The work function of a semiconductor can be changed by doping the semiconductor material. For example, undoped polysilicon has a work function of about 4.5 eV, whereas polysilicon doped with boron has a work function of about 5.0 eV. The work function of a semiconductor or conductor directly affects the threshold voltage of a transistor when the material is used as a gate electrode.

In prior art CMOS devices utilizing $SiO_2$ or SiON as the gate dielectric material, the work function can be changed or tuned by doping the polysilicon used for the gate electrode material. However, the Fermi-pinning caused by the use of high k gate dielectric materials as the gate dielectric pins or fixes the work function, so that doping the polysilicon gate material does not change the work function. Thus, a symmetric $V_t$ for the NMOS and PMOS transistors of a CMOS device having a high k material for the gate dielectric cannot be achieved by doping polysilicon gate material, as in $SiO_2$ or SiON gate dielectric CMOS devices.

Thus, what is needed in the art is a CMOS transistor device design and method of manufacturing thereof that has a high-k gate dielectric and a symmetric $V_t$ for the p channel metal oxide semiconductor (PMOS) transistor and n channel metal oxide semiconductor (NMOS) transistor of the CMOS device.

Another problem that arises when high k materials are used for the gate dielectric of a CMOS device is a high voltage threshold Vtp for a PMOS device. It is desirable to lower the Vtp in some CMOS transistor designs.

Furthermore, if polysilicon is used as a gate material when high k materials are used as a gate dielectric, poly (polysilicon) depletion can occur between the gate dielectric and the gate. When the CMOS device is operated in an inversion mode, poly depletion causes an increase in the electrical equivalent gate oxide, e.g., by about 4 to 5 Angstroms. It is desirable for the gate capacitance to be relatively high for increased gate control. However, poly depletion decreases the capacitance and lowers the drive current of the CMOS device, which is undesirable. Therefore, it would be advantageous to use metal as a gate material, to avoid the poly depletion effect. However, introducing metal as a gate material can cause integration problems in the manufacturing process. Many metals are not compatible with CMOS technologies, for example.

SUMMARY OF THE INVENTION

These and other problems are generally solved or circumvented, and technical advantages are generally achieved, by preferred embodiments of the present invention which provide a CMOS transistor device design and method of manufacture thereof with a metal gate for PMOS and NMOS transistors. A different gate dielectric material is used for the PMOS transistor than for the NMOS transistor. A thin layer of silicon is disposed between the gate dielectric material and the gate material. The thin layer of silicon pins the work function of the PMOS and NMOS transistors.

In accordance with a preferred embodiment of the present invention, a semiconductor device includes a workpiece, a first transistor formed in a first region of the workpiece, and a second transistor formed in a second region of the workpiece. The first transistor includes a first source and a first drain disposed in the workpiece, a first channel region disposed between the first source and the first drain, a first gate dielectric disposed over the first channel region, the first gate dielectric comprising a first material, a first silicon layer disposed over the first gate dielectric, and a first gate disposed over the first silicon layer. The second transistor includes a second source and a second drain disposed in the workpiece, a second channel region disposed between the second source and the second drain, a second gate dielectric disposed over the second channel region, the second gate dielectric comprising a second material, a second silicon layer disposed over the second gate dielectric, and a second gate disposed over the second silicon layer. The first transistor comprises a work function that is pinned by the first silicon layer, and the second transistor comprises a work function that is pinned by the second silicon layer.

In accordance with another preferred embodiment of the present invention, a CMOS device includes a workpiece, a PMOS transistor formed in a first region of the workpiece, and an NMOS transistor formed in a second region of the workpiece. The PMOS transistor includes a first source and a first drain disposed in the workpiece, a first channel region disposed between the first source and the first drain, a first gate dielectric disposed over the first channel region, the first gate dielectric comprising an aluminum-based dielectric material, a first silicon layer disposed over the first gate dielectric, the first silicon layer comprising about 1 to 10 monolayers or a sub-monolayer of silicon, and a first gate disposed over the first silicon layer. The NMOS transistor includes a second source and a second drain disposed in the workpiece, a second channel region disposed between the second source and the second drain, a second gate dielectric disposed over the second channel region, the second gate dielectric comprising a hafnium-based dielectric material, a second silicon layer disposed over the second gate dielectric, the second silicon layer comprising about 1 to 10 monolayers or a sub-monolayer of silicon, and a second gate disposed over the second silicon layer.

In accordance with another preferred embodiment of the present invention, a method of manufacturing a semiconductor device includes providing a workpiece, the workpiece comprising a first region and a second region, forming a first transistor in the first region of the workpiece, the first transistor including a first gate dielectric material, and forming a second transistor in the second region of the workpiece, the second transistor including a second gate dielectric material. The first gate dielectric material and the second gate dielectric material are exposed to a silicon-containing substance to form a first silicon layer over the first gate dielectric material and a second silicon layer over the second gate dielectric material, wherein the first silicon layer and the second silicon layer pin the work function of the first transistor and the second transistor, respectively.

Advantages of embodiments of the invention include providing methods of fabricating CMOS devices and structures thereof, wherein the PMOS transistor and the NMOS transistor have a substantially symmetric $V_t$. The threshold voltage $V_t$ is decreased compared to prior art CMOS devices, and the flat band voltage is easier to tune. Embodiments of the invention may utilize high-k dielectric materials as the gate dielectric, and may include metal, polysilicon, or FUSI gate electrodes. The metal gate electrodes may comprise either single metal or dual-work function metals, e.g., the gate electrode for the PMOS and NMOS transistors may be the same material or different materials. Embodiments of the invention enable the use of metal gate electrodes, preventing poly depletion problems that polysilicon gate electrodes can exhibit.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
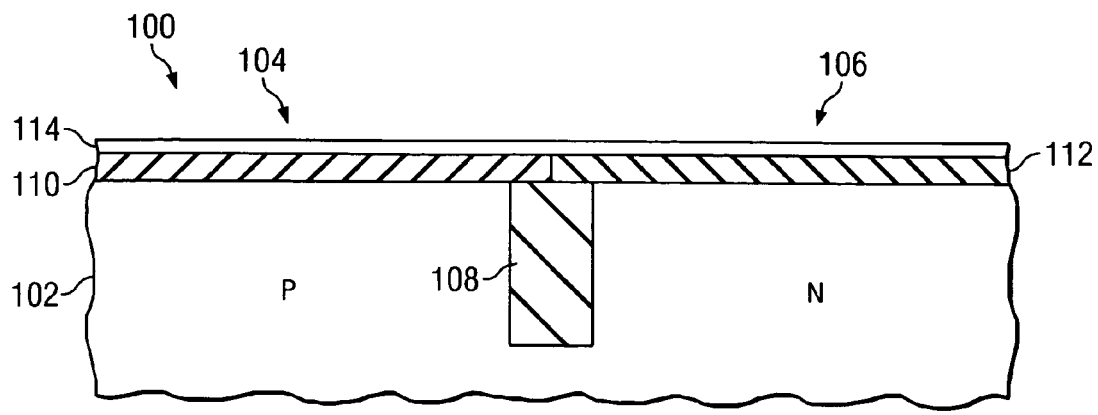
FIGS. 1 through 3 show cross-sectional views of a semiconductor device at various stages of manufacturing in accordance with a preferred embodiment of the present invention, wherein a CMOS device comprises a PMOS transistor having a first gate dielectric material and an NMOS transistor having a second gate dielectric material, wherein the first gate dielectric material and the second gate dielectric material comprise different materials and the transistor gates comprise a metal.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

High-k gate dielectrics generally yield orders of magnitude lower gate leakage current than $SiO_2$ or SiON gate dielectrics with the same effective oxide thickness (EOT). For low standby power (LSTP) and high performance (HP) applications, the use of a high-k material for a gate dielectric is a potential solution in the roadmap for the advanced technology nodes. Using high-k materials for gate dielectrics in CMOS devices has resulted in good EOT, lower gate leakage ($J_g$), mobility and hysteresis parameters, but the devices suffer from lack of $V_t$ controllability. In order to make high-k materials as gate dielectrics useful in CMOS applications, it is desirable that the CMOS device should be manufactured such that $V_{tn}$ and $V_{tp}$ are symmetrical; e.g., $V_{tn}=0.3$ V and $V_{tp}=-0.3$ V, as examples.

However, attempts to use a high-k dielectric material as a gate dielectric have been problematic. In particular, attempts have been made to use $HfO_2$, which is a high-k dielectric material having a dielectric constant of about 25, as the gate dielectric for both the PMOS and NMOS FETs of a CMOS device. The work function of a polysilicon gate using a $HfO_2$ gate dielectric has been found to be pinned, as a result of Fermi-pinning, at a point close to the conduction band of polysilicon, causing the polysilicon gate to function as N type polysilicon, even for the polysilicon gate doped with P type dopant, for the PMOS device. Therefore, the threshold voltage $V_{tp}$ of the PMOS device was much higher than expected; e.g., $V_{tp}$ was $-1.2$ V while $V_{tn}$ was 0.4 V, which is very asymmetric. The Fermi-pinning effect is suspected to be related to the Hf—Si bond at the gate electrode-gate dielectric interface, which is almost impossible to avoid with a polysilicon-$HfO_2$ gate stack structure. Therefore, the Fermi-pinning effect makes the use of polysilicon as a gate electrode incompatible with Hf-based high-k gate dielectric materials in CMOS devices. Fully silicided polysilicon (FUSI) gates have also exhibited Fermi-pinning effects and are undesirable for use as gate electrode materials when a high-k dielectric such as hafnium is used for a gate dielectric.

In U.S. patent application entitled, "CMOS Transistor With Dual High-k Gate Dielectric and Method of Manufacture Thereof," Ser. No. 10/870,616, filed on Jun. 17, 2004, which is incorporated herein by reference, a thin layer of a Fermi-pinning material such as $Al_2O_3$ is disposed adjacent and abutting a gate electrode of a PMOS device, disposed over a high-k dielectric material such as $HfO_2$, while using single layer of high-k dielectric material as the gate dielectric for the NMOS device. By doing so, polysilicon or FUSI may be used as the gate electrode while still achieving a symmetric $V_{tp}$ and $V_{tn}$ for the CMOS device. In the PMOS portion, a polysilicon-$Al_2O_3$ interface sets the work function in the P type regime, and in the NMOS portion, a polysilicon-Hf interface sets the work function in the N type regime.

In accordance with an embodiment of the present invention, a first high k dielectric is used as the gate dielectric of a PMOS device, a second high k dielectric is used as the gate dielectric of an NMOS device, a Fermi-pinning material is used as a gate dielectric for the PMOS device, and the gate of both the PMOS and NMOS device comprises a metal. A single type of metal may be used for the gate material, e.g., the PMOS gate and the NMOS gate may comprise the same metal. Before the gate is formed, a surface of the gate dielectric is treated with silicon, forming a thin layer of silicon over each gate dielectric material. The silicon pins the work function of the PMOS device to P type and pins the work function of the NMOS device to N type.

The present invention will be described with respect to preferred embodiments in a specific context, namely a CMOS transistor. Embodiments of the present invention may also be applied, however, to other semiconductor device applications where two or more transistors are required. Note that in the drawings shown, only one PMOS device and one NMOS device are shown; however, there may be many PMOS and NMOS devices formed during each of the manufacturing processes described herein.

Figure 2:
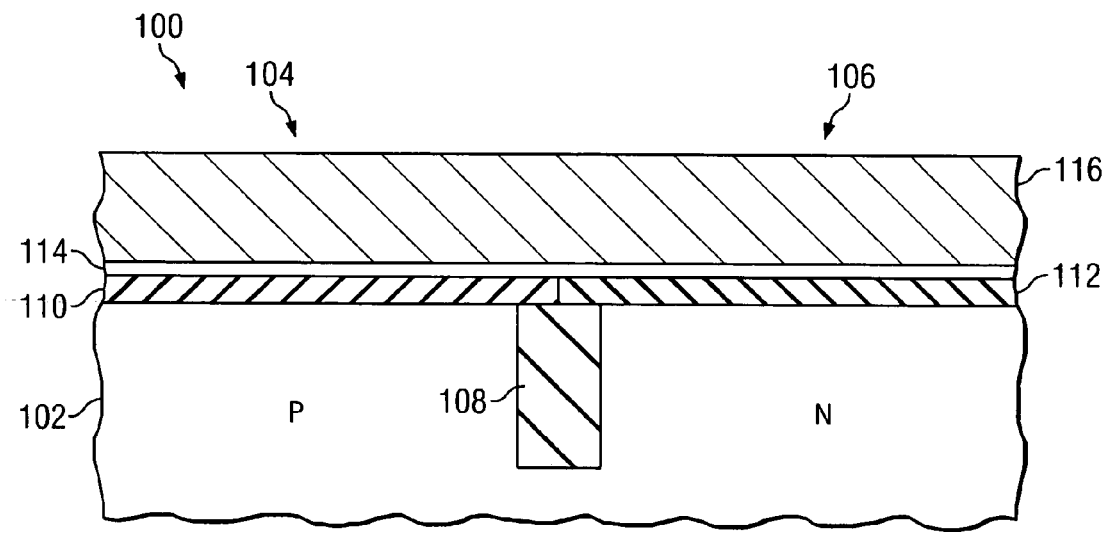
Figure 3:
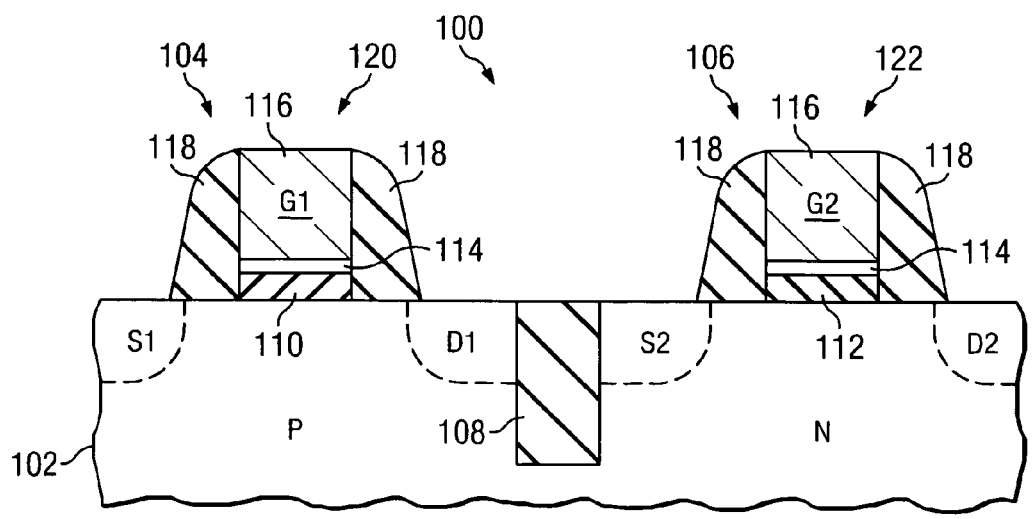

FIGS. 1 through 3 show cross-sectional views of a semiconductor device 100 at various stages of manufacturing in accordance with a preferred embodiment of the present invention. With reference now to FIG. 1, there is shown a semiconductor device 100 in a cross-sectional view including a workpiece 102. The workpiece 102 may include a semiconductor substrate comprising silicon or other semiconductor materials covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may also comprise a silicon-on-insulator (SOI) substrate.

The workpiece 102 includes a first region 104 and a second region 106. The first region 104 comprises a region where a first transistor comprising a PMOS device or PMOSFET, for example, will be formed. The second region 106 comprises a region where a second transistor comprising an NMOS device or NMOSFET will be formed, for example. The PMOS device and NMOS device are not shown in FIG. 1: see FIG. 3 at 120 and 122, respectively.

The first region 104 and the second region 106 may be separated by an optional shallow trench isolation (STI) region 108 formed in the workpiece 102, as shown. The first region 104 may be lightly doped with N type dopants, and the second region 106 may be lightly doped with P type dopants. In general, the workpiece 102 is doped with N or P type dopants depending on whether the junctions of the transistor to be formed will be P or N type, respectively. In the embodiment shown, the first region 104 comprises a region where a PMOS transistor will be formed, indicated by the "P" in FIG. 1., and the workpiece 102 is doped with N type dopent, for example. The second region 106 comprises a region where an NMOS transistor will be formed, indicated by the "N" in FIG. 1., and the workpiece 102 is doped with a P type dopant, for example.

A first gate dielectric material 110 is formed over the first region 104 of the workpiece 102, and a second gate dielectric material 112 is formed over the second region 106 of the workpiece 102. The second gate dielectric material 112 preferably comprises a different material and may comprise a different thickness than the first gate dielectric material 110 in a preferred embodiment of the present invention. The first gate dielectric material 110 and/or the second gate dielectric material 112 may be deposited over the entire workpiece 102 and may then be removed in the second region 106 or first region 104, respectively, for example. The first region 104 and/or second region 106 may be masked while the first gate dielectric material 110 and/or the second gate dielectric material 112 may be deposited over the entire workpiece 102, for example.

The first gate dielectric material 110 preferably comprises a high-k dielectric material having a dielectric constant of about 4.0 or greater, in one embodiment. The first gate dielectric material 110 preferably comprises $Si_3N_4$, $Al_2O_3$, $Ta_2O_5$, $HfO_2$, $TiO_2$, $HfSiO_x$, $ZrO_2$, $ZrSiO_x$, $La_2O_3$, $CeO_2$, $Bi_4Si_2O_{12}$, $WO_3$, $Y_2O_3$, $LaAlO_3$, BST ($Ba_{(a-x)}Sr_xTiO_3$), PST ($PbSc_xTa_{(1-a)}O_3$), PZN ($PbZn_xNb_{(1-x)}O_3$), PZT ($PbZr_xTi_{(1-x)}O_3$), PMN ($PbMg_xNb_{(1-x)}O_3$), or combinations thereof, as examples, although alternatively, the first gate dielectric material 110 may comprise other high k insulating materials or other dielectric materials.

The first gate dielectric material 110 may comprise a single layer of material, or alternatively, the first gate dielectric material 110 may comprise two or more layers, wherein the top layer comprises a Fermi-pinning material. In one embodiment, one or more of these materials can be included in the first gate dielectric material 110 in different combinations or in stacked layers. The first gate dielectric material 110 may be deposited by chemical vapor deposition (CVD), atomic layer deposition (ALD), metal organic chemical vapor deposition (MOCVD), physical vapor deposition (PVD), or jet vapor deposition (JVD), as examples, although alternatively, the first gate dielectric material 110 may be deposited using other suitable deposition techniques. The first gate dielectric material 110 preferably comprises a thickness of about 5 Å to about 60 Å in one embodiment, although alternatively, the first gate dielectric material 110 may comprise other dimensions, such as about 80 Å or less, as an example.

The first gate dielectric material 110 preferably comprises a material that is adapted to pin a subsequently deposited metal layer to P type, in one embodiment. In one embodiment, the first gate dielectric material 110 preferably comprises a Fermi-pinning material such as an aluminum-containing material disposed at the top surface thereof. In another embodiment, the first gate dielectric material 110 preferably comprises an aluminum-bearing material at a top surface thereof.

The second gate dielectric material 112 preferably comprises a high-k dielectric material having a dielectric constant of about 4.0 or greater, in one embodiment. The second gate dielectric material 112 preferably comprises $Si_3N_4$, $Al_2O_3$, $Ta_2O_5$, $HfO_2$, $TiO_2$, $HfSiO_x$, $ZrO_2$, $ZrSiO_x$, $La_2O_3$, $CeO_2$, $Bi_4Si_2O_{12}$, $WO_3$, $Y_2O_3$, $LaAlO_3$, BST ($Ba_{(a-x)}Sr_xTiO_3$), PST ($PbSc_xTa_{(1-a)}O_3$), PZN ($PbZn_xNb_{(1-x)}O_3$), PZT ($PbZr_xTi_{(1-x)}O_3$), PMN ($PbMg_xNb_{(1-x)}O_3$), or combinations thereof, as examples, although alternatively, the second gate dielectric material 112 may comprise other high k insulating materials or other dielectric materials. The second gate dielectric material 112 may comprise a single layer of material, or alternatively, the second gate dielectric material 112 may comprise two or more layers. In one embodiment, one or more of the exemplary materials listed can be included in the second gate dielectric material 112 in different combinations or in stacked layers. The second gate dielectric material 112 may be deposited by CVD, ALD, MOCVD, PVD, or JVD, as examples, although alternatively, the second gate dielectric material 112 may be deposited using other suitable deposition techniques. The second gate dielectric material 112 preferably comprises a thickness of about 5 Å to about 60 Å in one embodiment, although alternatively, the second gate dielectric material 112 may comprise other dimensions, such as about 80 Å or less, as an example.

The second gate dielectric material 112 preferably comprises a material that is adapted to pin a subsequently deposited metal layer to N type, in one embodiment. In one embodiment, the second gate dielectric material 112 preferably comprises a hafnium-bearing material at a top surface thereof.

The first gate dielectric material 110 and the second gate dielectric material 112 are exposed to a silicon-containing substance to form a silicon layer 114 on the top surface of the first gate dielectric material 110 and the second gate dielectric material 112, as shown in FIG. 1. The silicon layer 114 may comprise a few monolayers, e.g., about 1 to 10 monolayers of silicon, in one embodiment. The silicon layer 114 may also comprise a sub-monolayer, e.g., the silicon layer may not fully cover the top surface of the first gate dielectric material 110 and/or the second gate dielectric material 112. The silicon layer 114 may comprise a thickness of about 30 Å or less, for example, although alternatively, the silicon layer 114 may comprise other dimensions. The silicon-containing substance may comprise silane gas, e.g., $SiH_4$. In other embodiments, the silicon-containing substance may comprise $SiCl_4$ or $Si[N(CH_3)C_2H_5]_4$, as examples. Alternatively, the silicon-containing substance may comprise other materials, for example. In one embodiment, the silicon layer 114 is formed by exposing the workpiece 102 to silane gas for about 5 minutes or less at a temperature of about 300 to 500 degrees C., for example. Alternatively, the silicon layer 114 may be formed at other temperatures and lengths of time, for example.

A gate material 116 is formed over the silicon layer 114, as shown in FIG. 2. The gate material 116 preferably comprises a conductor such as a metal, in one embodiment. The gate material 116 preferably comprises a metal having a work function close to a midgap value of silicon, for example. The gate material 116 may comprise TiN, and alternatively may comprise TaN, in one embodiment. The gate material 116 preferably comprises TiN, HfN, TaN, ZrN, LaN, TiN, HfN, TaN, RuN, WN, W, a silicided form of these metals (for example, TiSiN, HfSiN, TaSiN, ZrSiN, LaSiN, TiSiN, HfSiN, TaSiN, RuSiN, WSiN, or WSi), a semiconductive material such as silicon, or combinations thereof, as examples. The gate material 116 may comprise a thickness of about 10 Å to about 1000 Å, for example. Alternatively, the gate material 116 may comprise other conductive materials or semiconductive materials and may comprise other dimensions, for example. The gate material 116 may comprise a plurality of stacked gate materials, such as a metal underlayer with a polysilicon cap layer disposed over the metal underlayer, or a combination of a plurality of metal layers that form a gate electrode stack. The gate material 116 may be deposited using CVD, PVD, ALD, or other deposition techniques, as examples.

If the gate material 116 comprises a semiconductive material, preferably, the gate material 116 is doped, by doping the gate material 116 with a P type dopant such as boron in the first region 104 and with an N type dopant such as phosphorous or antimony, in the second region 106, for example. Doping the gate material 116 makes the semiconductive material conductive or more conductive.

The gate material 116, silicon layer 114, and first and second gate dielectric materials 112 and 114 are patterned to form a PMOS transistor 120 and an NMOS transistor 122, as shown in FIG. 3. Spacers 118 may be formed over the sidewalls of the gate material 116, silicon layer 114, and gate dielectric materials 112 and 114. The workpiece 102 may be doped and/or implanted to form the source S1 and S2 and drain D1 and D2 of the PMOS and NMOS devices 120 and 122, as shown.

One or more insulating materials (not shown) may be deposited over the PMOS transistor 120 and NMOS transistor 122, and contacts may be formed in the insulating materials in order to make electrical contact with the gates, sources and/or drains. Additional metallization and insulating layers may be formed and patterned over the top surface of the insulating material and contacts. A passivation layer (not shown) may be deposited over the insulating layers or the PMOS transistor 120 and NMOS transistor 122. Bond pads (also not shown) may be formed over contacts, and the semiconductor device 100 may then be singulated or separated into individual die. The bond pads may be connected to leads of an integrated circuit package (not shown) or other die, for example, in order to provide electrical contact to the transistors 120 and 122 of the semiconductor device 100.

Advantageously, the novel silicon layer 114 formed over the first gate dielectric material 110 and the second gate dielectric material 112 bonds to the underlying first gate dielectric material 110 and second gate dielectric material 112. When the gate material 116 is formed over the silicon layer 114, the silicon layer 114 bonded to the underlying first gate dielectric material 110 pins the work function of the gate material 116 in the first region 104 to a value close to the valence band of silicon. Thus, the silicon layer 114 pins the work function of the gate material 116 in the first region 104 to P type, which is desirable, because a PMOS transistor 120 is formed in the first region 104 of the workpiece 102. The silicon layer 114 in the first region 104 sets the surface Fermi-levels of the top surface of the first gate dielectric material 110 to P type, for example.

The silicon layer 114 bonded to the underlying second gate dielectric material 112 pins the work function of the gate material 116 in the second region 106 to a value close to the conduction band of silicon. Thus, the silicon layer 114 pins the work function of the gate material 116 in the second region 106 to N type, which is desirable, because an NMOS transistor 122 is formed in the second region 106 of the workpiece 102. The silicon layer 114 in the second region 106 sets the surface Fermi-levels of the top surface of the second gate dielectric material 112 to N type, for example.

The silicon layer 114 chemically treats the surface of the underlying first gate dielectric material 110 and second gate dielectric material 112 to create bonds that will set the surface work function. The Fermi-level state after the silicon treatment is a function of the parameters of the silicon-containing substance treatment, e.g., exposure time, pressures, and flow rate. These and other parameters of the silicon-containing substance exposure may be varied to tune the work function and achieve the desired $V_t$ levels, for example. After the Fermi-levels of the top surface of the first gate dielectric material 110 and second gate dielectric material 112 are set, the $V_{fb}$ and hence, the $V_{tn}/V_{tp}$ of the device 100 is determined. Advantageously, because the silicon layer 116 is thin, e.g., a few monolayers or a sub-monolayer thick, the effective oxide thickness (EOT) is not substantially increased.

FIGS. 4 through 8 show cross-sectional views of a method of forming a CMOS device at various stages of manufacturing in accordance with another preferred embodiment of the present invention, wherein portions of the workpiece are masked while the various material layers are formed. Like numerals are used for the various elements that were described in FIGS. 1 through 3. To avoid repetition, each reference number shown in FIGS. 4 through 8 is not described again in detail herein. Rather, similar materials x02, x04, x06, x08, etc . . . are preferably used for the various material layers shown as were described for FIGS. 1 through 3, where x=1 in FIGS. 1 through 3 and x=2 in FIGS. 4 through 8. As an example, the preferred and alternative materials and dimensions described for the first and second gate dielectric materials 110 and 112 in the description for FIGS. 1 through 3 are preferably also used for the gate dielectric materials 210 and 212 of FIGS. 4 through 8.

Figure 4:
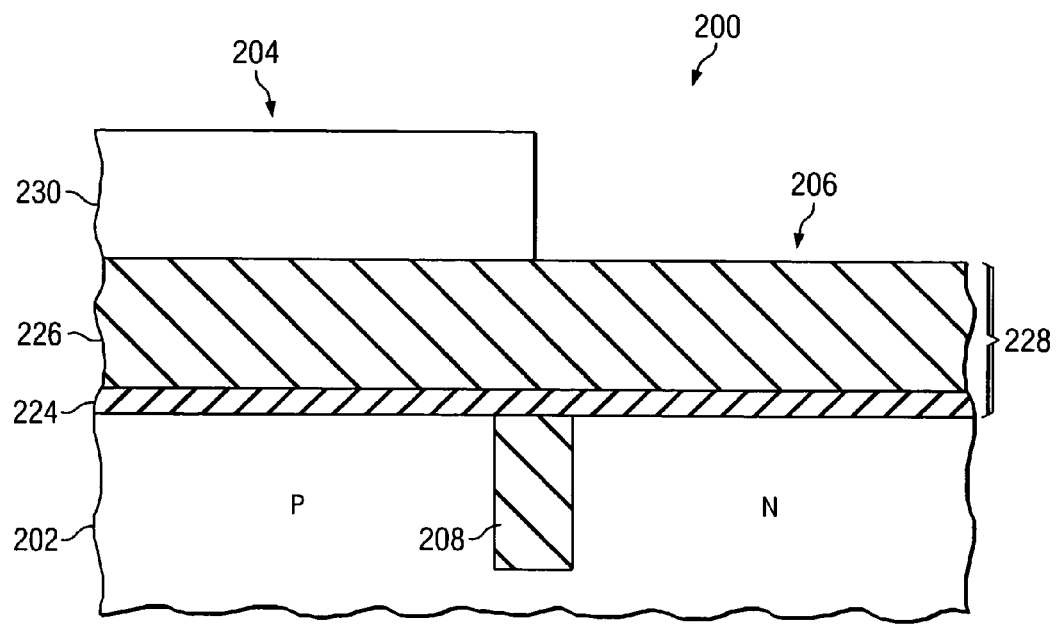
FIGS. 4 through 8 show cross-sectional views of a method of forming a CMOS device at various stages of manufacturing in accordance with another preferred embodiment of the present invention, wherein portions of the workpiece are masked while the various material layers are formed.

Referring next to FIG. 4, first, the workpiece 202 is preferably cleaned using a pre-gate clean process to remove any contaminant or native oxide from the top surface of the workpiece 202. The pre-gate treatment may comprise a HF, HCl or ozone based cleaning treatment, as examples, although the pre-gate treatment may alternatively comprise other chemistries.

A hard mask 228 is deposited over the workpiece 202. The hard mask 228 preferably comprises a first layer 224 and a second layer 226 disposed over the first layer 224, as shown. Alternatively, the hard mask 228 may comprise a single layer of an oxide or a nitride material, for example. In the embodiment shown in FIG. 4, the first layer 224 of the hard mask 228 preferably comprises about 300 Angstroms of an oxide material such as tetraethoxysilate (TEOS), although alternatively, the first layer 224 may comprise other insulating materials deposited in other dimensions, for example.

The first layer 224 may be deposited by plasma-enhanced chemical vapor deposition (PECVD) or by other deposition techniques, as examples. The second layer 226 preferably comprises about 1500 Angstroms of a nitride material such as $Si_xN_y$, for example, although alternatively, the second layer 226 may comprise other insulating materials deposited in other dimensions, for example. The second layer 226 may comprise amorphous Si or polysilicon, as examples. The second layer 226 may be deposited by PECVD or by other deposition techniques, as examples.

A first layer of photoresist 230 is deposited over the second layer 226 of the hard mask 228, as shown in FIG. 4. The first layer of photoresist 230 may patterned with a mask using traditional lithography techniques, although alternatively, the first layer of photoresist 230 may be directly patterned using electron beam lithography (EBL) or other direct etching technique, as examples.

The first layer of photoresist 230 is used to pattern at least the second layer 226 of the hard mask 228. For example, exposed portions of the second layer 226 in the second region 206 may be etched using the first layer of photoresist 230 remaining over the first region 204 as a mask. The etch process may be designed to stop when the first layer 224 of the hard mask 228 is reached. The first layer of photoresist 230 is then stripped or removed, and the second layer 226 is then used as a mask to pattern the first layer 224. Alternatively, the first layer of photoresist 230 may be used as a mask to etch both the second layer 226 and the first layer 224 of the hard mask 228, for example. The first layer of photoresist 230 is then stripped, as shown in FIG. 5.

Figure 5:
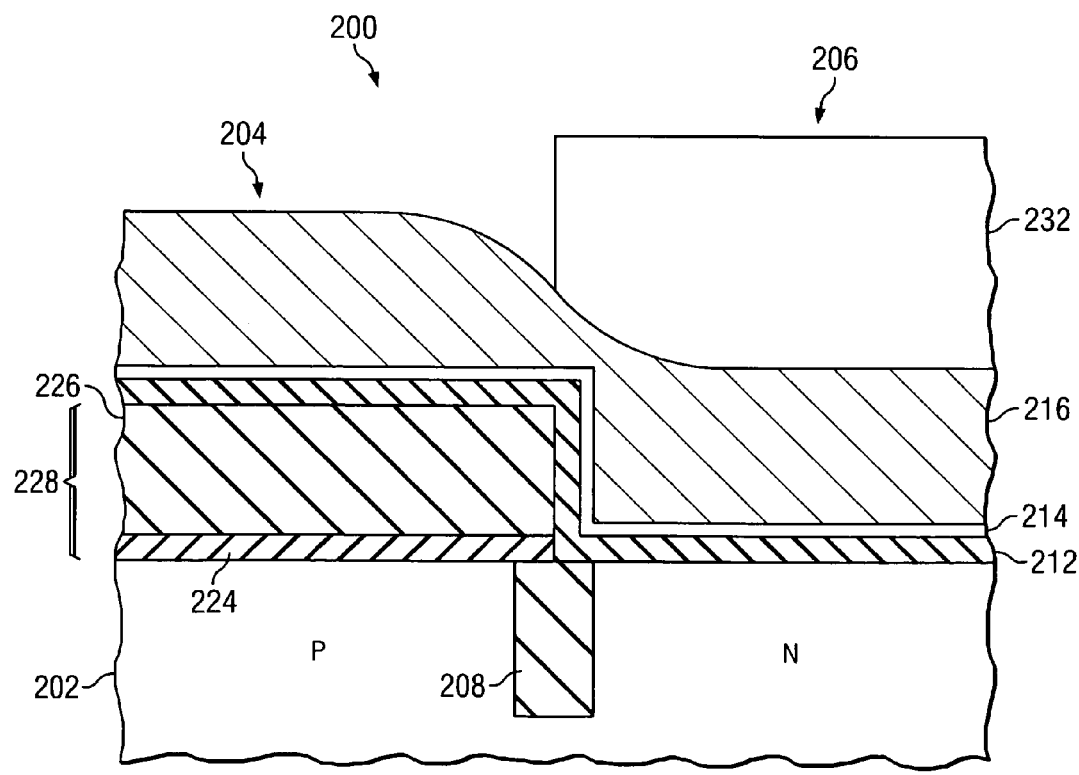

A second gate dielectric material 212 is deposited over the patterned hard mask 112 and exposed portions of the workpiece 102, as shown in FIG. 5. Note that although the first gate dielectric material has not yet been deposited, the gate dielectric material 212 is referred to herein as the second gate dielectric material 212, to be consistent with the position of the material layer 212 in the second region 206 of the figures. The second gate dielectric material 212 preferably comprises a hafnium-based high k dielectric material, for example.

A first silicon layer 214 comprising a few monolayers or sub-monolayer of silicon is formed over the second gate dielectric material 212 by exposing the second gate dielectric material 212 to a silicon-containing substance. The silicon layer 214 is referred to as a "first" silicon layer 214 because it is the first in time to be deposited, before the second silicon layer 236 shown in FIG. 7. The first silicon layer 214 bonds with the hafnium-based high k dielectric material of the second gate dielectric material 212, forming a Hf—Si bond at the interface of the second gate dielectric material 212 and the first silicon layer 214. The HF—Si bond sets the work function of the NMOS transistor device 222 (see FIG. 8).

Referring again to FIG. 5, a second gate material 216 is deposited over the first silicon layer 214. Note that although the first gate material has not yet been deposited, the gate material 216 is referred to herein as the second gate material 216, to be consistent with the position of the material layer 212 in the second region 206 of the figures. Preferably the second gate material 216 comprises a metal such as TaN or TiN, in one embodiment. The second gate material 216 preferably comprises about 10 Å to about 1000 Å of TiN, HfN, TaN, ZrN, LaN, TiN, HfN, TaN, RuN, WN, W, a silicided form of these metals, a semiconductive material, or combinations thereof, for example. However, if the gate material 216 comprises a semiconductive material, preferably, the second gate material 216 is N-doped, by doping the second gate material 216 with N type dopants such as phosphorous or antimony, for example.

A second layer of photoresist 232 is deposited over the second gate material 216, as shown in FIG. 5. The second layer of photoresist 232 may patterned using a mask using traditional lithography techniques to remove the second layer of photoresist 232 from over the first region 204 of the workpiece 202, as shown, although alternatively, the second layer of photoresist 232 may be directly patterned.

Figure 6:
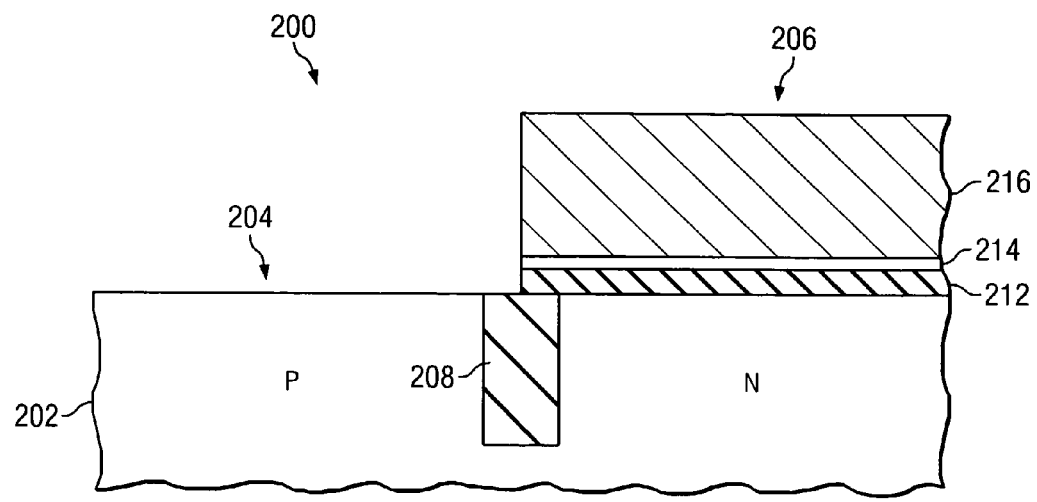

The second layer of photoresist 232 is used as a mask to pattern the second gate material 216, the first silicon layer 214, and the second gate dielectric material 212, and to remove the hard mask 228 from the first region 204 of the workpiece 202, as shown in FIG. 6. For example, exposed portions of the second gate material 216, first silicon layer 214, second gate dielectric material 212, and hard mask 228 may be etched away from the first region 204 of the workpiece 202 using the second layer of photoresist 232 as a mask. The second layer of photoresist 232 is then stripped or removed from over the second region 206 of the workpiece 202. Any excess second gate material 216, first silicon layer 214, and second gate dielectric material 212 may be removed from over the optional STI region 208 proximate the interface of the first region 204 and second region 206 using a chemical-mechanical polish (CMP) process or an etch process, for example, leaving the structure shown in FIG. 6. The exposed surface of the workpiece 202 may be cleaned using a pre-gate clean process.

Figure 7:
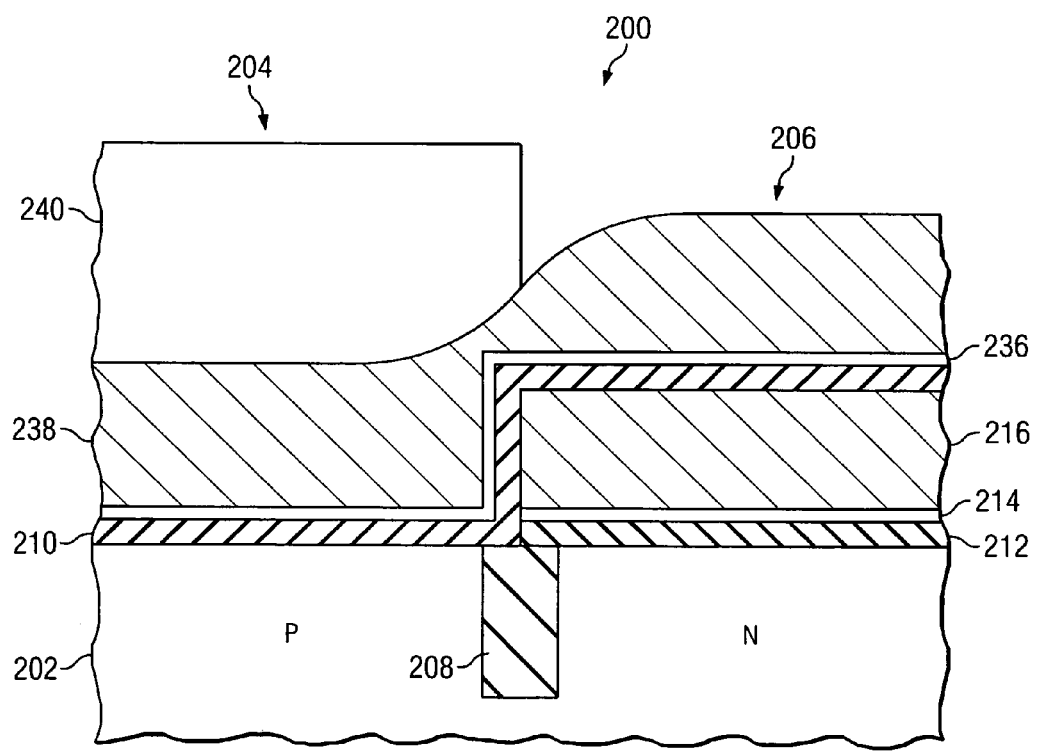

Next, a first gate dielectric material 210 is deposited over exposed portions of the workpiece 202 in the first region 204 and over the patterned second gate material 216, first silicon layer 214, and second gate dielectric material 212 in the second region 206, as shown in FIG. 7. The first gate dielectric material 210 preferably comprises a different material than the second gate dielectric material 212 in one embodiment of the present invention. In one embodiment, the first gate dielectric material 210 preferably comprises an aluminum-based high k dielectric material.

Next, a second silicon layer 236 is formed over the first gate dielectric material 210. The second silicon layer 236 comprises a few monolayers or sub-monolayer of silicon and may be formed over the first gate dielectric material 210 by exposing the first gate dielectric material 210 to a silicon-containing substance or gas. The second silicon layer 236 bonds with the aluminum-based high k dielectric material of the first gate dielectric material 210, forming an Al—Si bond at the interface of the first gate dielectric material 210 and the second silicon layer 236. The Al—Si bond sets the work function of the PMOS transistor device 220 (see FIG. 8).

A first gate material 238 is deposited over the second silicon layer 236, also shown in FIG. 7. The first gate material 238 preferably comprises a conductor, such as a metal, although alternatively, other conductive and semiconductive materials may be used for the first gate material 238. The first gate material 238 may comprise the same material as the second gate material 216, for example. Alternatively, the first gate material 238 may comprise a different material than the second gate material 216, for example. The first gate material 238 preferably comprises about 10 Å to about 1000 Å of TiN, HfN, TaN, ZrN, LaN, TiN, HfN, TaN, RuN, WN, W, a silicided form of these metals, a semiconductive material, or combinations thereof. If the first gate material 238 comprises a semiconductive material, preferably, the first gate material 238 is P-doped, by doping the first gate material 238 with a P type dopant such as boron, as an example.

A third layer of photoresist 240 is deposited over the first gate material 238, as shown in FIG. 7. The third layer of photoresist 240 may patterned using a mask by traditional lithography techniques to remove the third layer of photoresist 240 from the second region 206 of the workpiece 202, as shown, although alternatively, the third layer of photoresist 240 may be directly patterned.

The third layer of photoresist 240 is then used as a mask to pattern the first gate material 238, the second silicon layer 236, and the first gate dielectric material 210. For example, exposed portions of the first gate material 238, the second silicon layer 236, and the first gate dielectric material 210 may be etched away from the second region 206 of the workpiece 202 using the third layer of photoresist 240 as a mask. The third layer of photoresist 240 is then stripped or removed from over the first region 204 of the workpiece 202.

Any excess first gate material 238, second silicon layer 236, and first gate dielectric material 210 may be removed from over the optional STI region 208 proximate the interface of the first region 204 and second region 206 using a chemical-mechanical polish (CMP) process or an etch process, for example (not shown).

Figure 8:
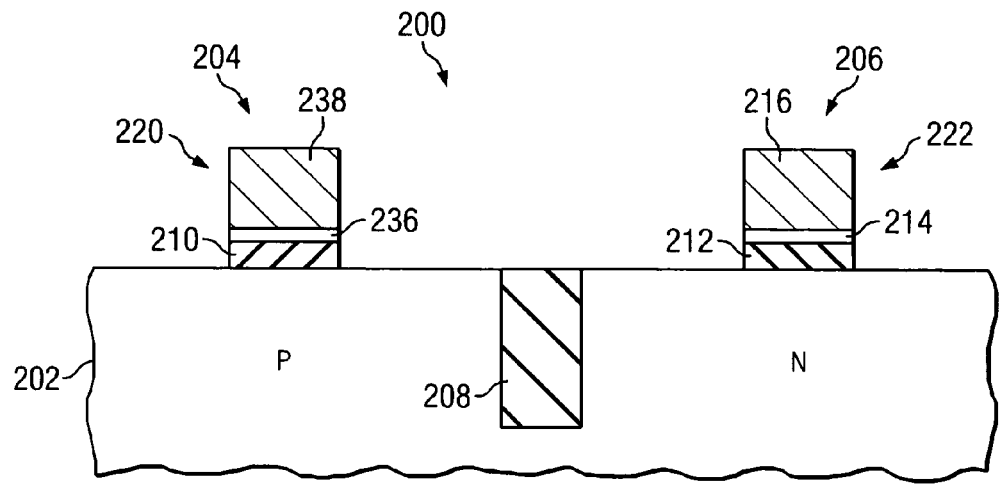

Preferably using a single lithography step, e.g., using a single layer of photoresist and using a single mask to pattern the photoresist, the first gate material 238, the second silicon layer 236, the first gate dielectric material 210, the second gate material 216, the first silicon layer 214, and the second gate dielectric material 212 are simultaneously patterned with a desired pattern for a CMOS device, leaving the structure shown in FIG. 8, wherein a PMOS transistor 220 is formed in the first region 204, and an NMOS transistor 222 is formed in the second region 206. Spacers may be formed over the sidewalls of the first gate material 238, the second silicon layer 236, the first gate dielectric material 210, the second gate material 216, the first silicon layer 214, and the second gate dielectric material 212, and exposed portions of the workpiece 202 may be implanted with dopants to form the source and drain of the transistors 220 and 222 (not shown; see FIG. 3).

The gate and gate dielectric materials for either the PMOS transistor 220 or the NMOS transistor 222 may be deposited first, in accordance with embodiments of the present invention. For example, in the embodiment described herein with reference to FIGS. 4 through 8, the NMOS transistor 222 gate dielectric and gate materials are deposited first. Alternatively, the PMOS transistor 220 gate dielectric and gate materials may be deposited first.

Other optional elements may be included in the CMOS devices described herein. For example, before forming spacers over the sidewalls of the gate dielectric and gates, an optional thin insulator may be formed over the top surface of the sources and drains, the sidewalls of the gate dielectrics, silicon layers, and gates, (not shown.) The spacers are then formed over the thin insulator. The thin insulator may comprise an oxide, and the spacers may comprise a nitride, although alternatively, other materials may be used for the thin insulator and the spacers, for example. The sources, drains, and/or the gates of the transistors 220 and 222 may include an optional silicide material formed at a top surface thereof, often referred to as a salicide because the formation of the silicide may be self-aligning, also not shown. The silicide may comprise about 100 Å to 300 Å of $TiSi_x$, $CoSi_x$, or $NiSi_x$, although the silicide may alternatively comprise other materials and thicknesses, as examples. The sources and drains of the transistors 220 and 222 may include lightly doped areas and deeper implantation regions, not shown.

Another preferred embodiment of the present invention is shown in FIGS. 9 through 13. Like numerals are used for the various elements that were described in FIGS. 1 through 3 and FIGS. 4 through 8, and to avoid repetition, each reference number shown in FIGS. 9 through 13 is not described again in detail herein. Rather, similar materials x02, x04, x06, x08, etc . . . are preferably used for the various material layers shown as were described for FIGS. 1 through 3 and 4 through 8, where x=1 in FIGS. 1 through 3, x=2 in FIGS. 4 through 8, and x=3 in FIGS. 9 through 13.

Figure 9:
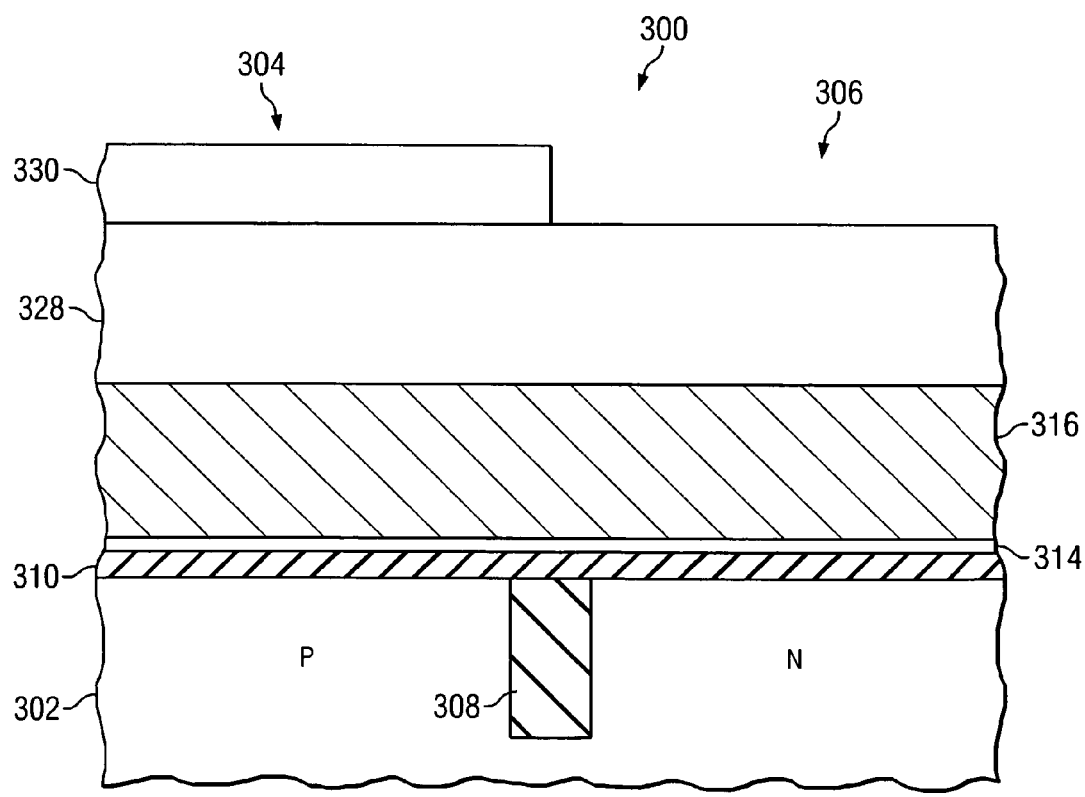
FIGS. 9 through 13 show cross-sectional views of a method of forming a CMOS device at various stages of manufacturing in accordance with another preferred embodiment of the present invention.

In this embodiment, one of the high k dielectric materials (e.g., for either the PMOS transistor or the NMOS transistor) is deposited before the hard mask is deposited. For example, after a pre-gate cleaning step, the first gate dielectric material 310 preferably comprising an aluminum-based high k dielectric material is deposited over the workpiece 302, as shown in FIG. 9. A first silicon layer 314 is formed over the first gate dielectric material 310 by exposing the first gate dielectric material 310 to a silicon-containing substance or gas. The first silicon layer 314 bonds with the aluminum-based high k dielectric material of the first gate dielectric material 310, forming an Al—Si bond at the interface of the first gate dielectric material 310 and the first silicon layer 314. The Al—Si bond sets the work function of the PMOS transistor device 320 (see FIG. 13). A first gate material 316 is formed over the first silicon layer 314. The first gate material 316 may comprise a metal with an optional top polysilicon layer, for example. An optional implantation step may be used to implant the first gate material 316 with polysilicon, for example.

Figure 10:
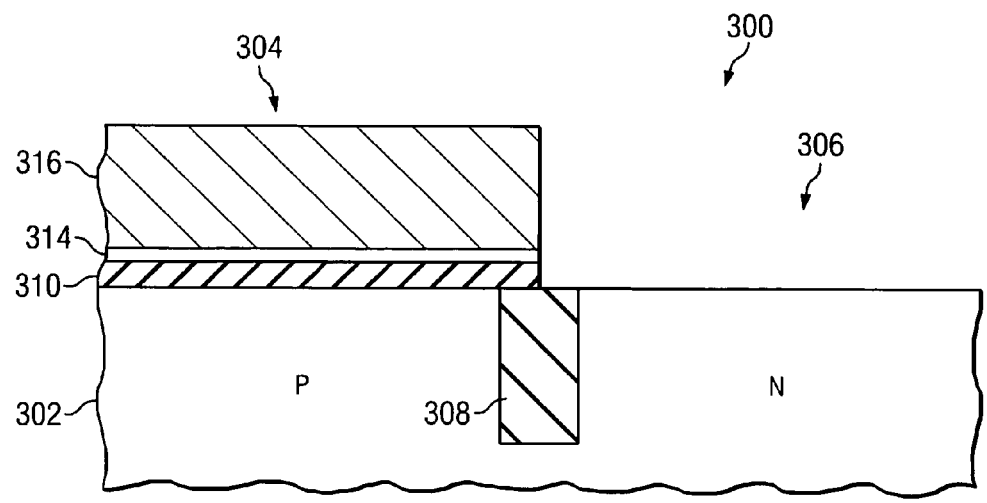

A hard mask 328 is deposited over the first gate material 316, as shown, and a layer of photoresist 330 is deposited over the hard mask 328. The resist 330 is used to pattern the hard mask 328, and the hard mask 328 is used to pattern the first gate material 316, first silicon layer 314, and the first gate dielectric material 310, removing these material from the second region 306 of the workpiece 302. The resist 330 and hard mask 328 are then removed, as shown in FIG. 10.

Figure 11:
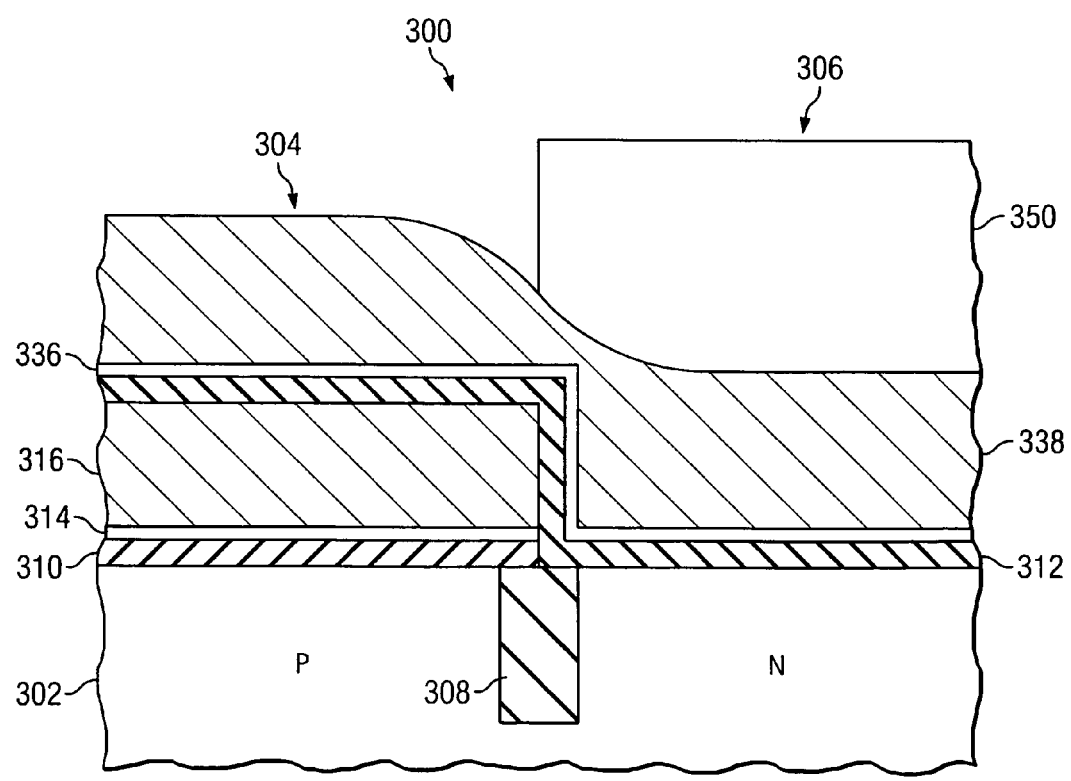
Figure 12:
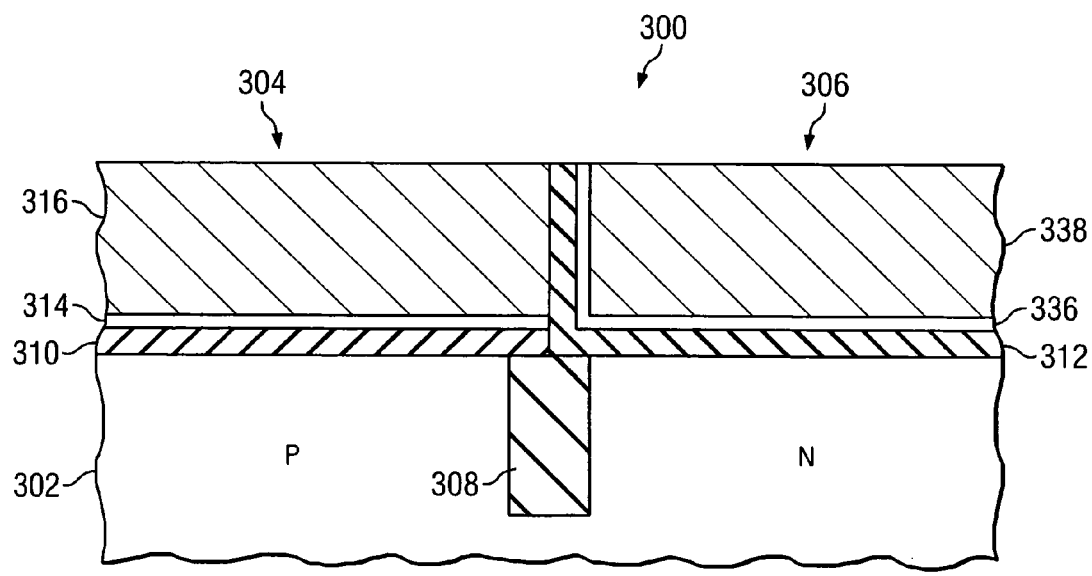

Next, the second gate dielectric material 312, preferably comprising a high k hafnium-based dielectric material, is deposited over the exposed second region 306 of the workpiece, and over the first gate material 316, as shown in FIG. 11.

A second silicon layer 336 is formed over the second gate dielectric material 312. The second silicon layer 336 comprises a few monolayers or sub-monolayer of silicon and may be formed over the second gate dielectric material 312 by exposing the second gate dielectric material 312 to a silicon-containing substance. The second silicon layer 336 bonds with the hafnium-based high k dielectric material of the second gate dielectric material 312, forming a Hf—Si bond at the interface of the second gate dielectric material 312 and the second silicon layer 336. The Hf—Si bond sets the work function of the NMOS transistor device 322 (see FIG. 13).

A second gate material 338 is then deposited over the second silicon layer 336, followed by optional polysilicon deposition and/or implantation steps. A layer of photoresist 350 is deposited over the second gate material 338, as shown in FIG. 11. The photoresist 350 is used as a mask while the second gate material 338, second silicon layer 336, and second gate dielectric material 312 are removed from over the first gate material 316 in the first region 304 of the workpiece 302, leaving the structure shown in FIG. 12.

Figure 13:
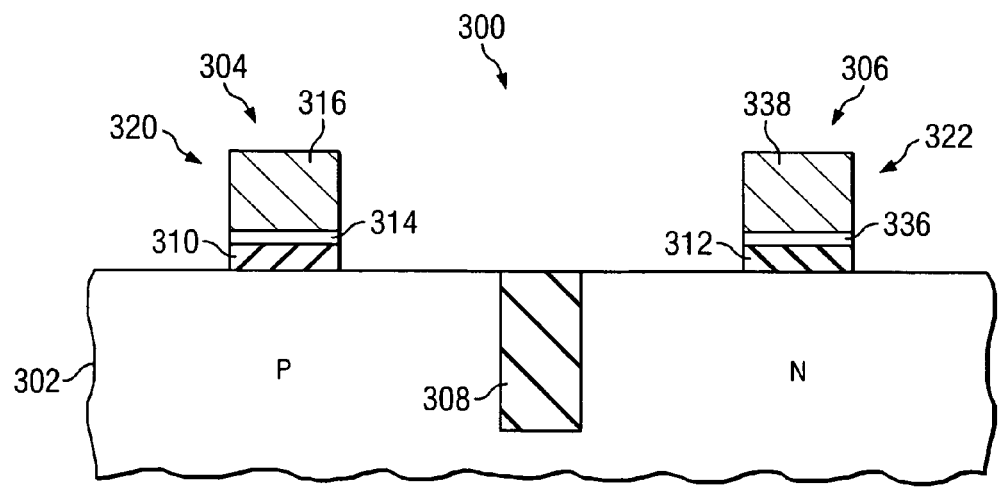

The first gate material 316, first silicon layer 314, first gate dielectric material 310, second gate material 338, second silicon layer 336, and second gate dielectric material 312 are then patterned to form PMOS transistor 320 and NMOS transistor 322, as shown in FIG. 13. The manufacturing process is then continued to complete the fabrication of the semiconductor device 300.

Figure 14:
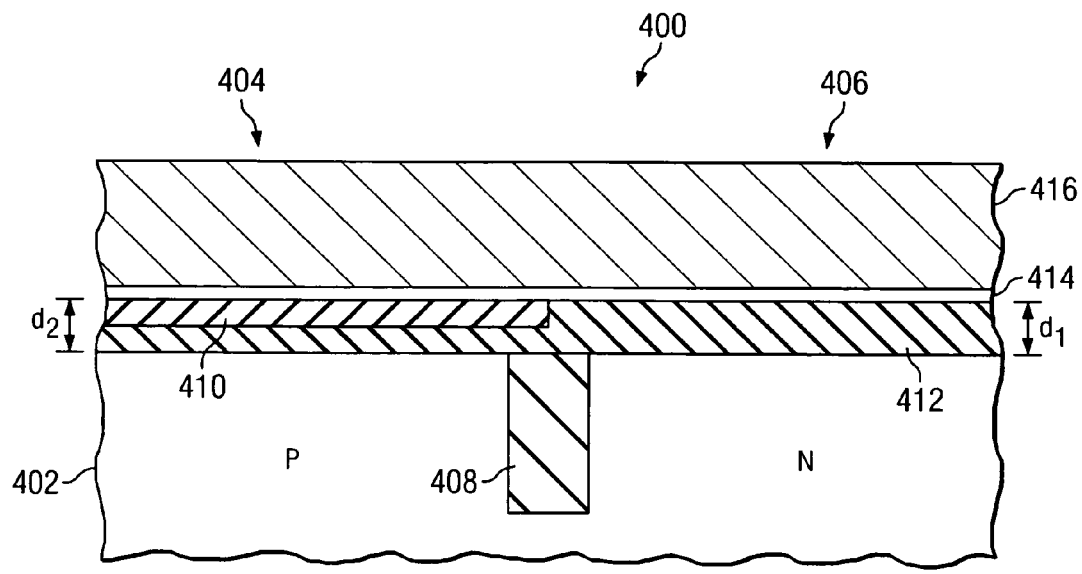
FIGS. 14 and 15 show embodiments of the invention wherein the PMOS transistor gate dielectric includes a first gate dielectric and a second gate dielectric material.
Figure 15:
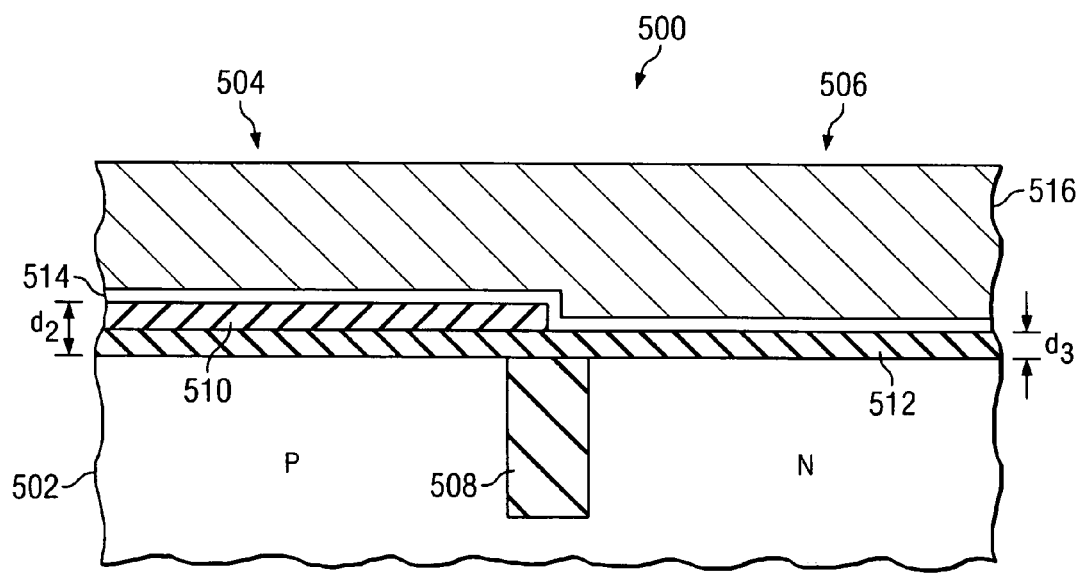

In one embodiment, a first gate dielectric material 412 and 512 may be disposed within both the PMOS transistor and NMOS transistor, as shown in FIGS. 14 and 15, and a second gate dielectric material 410 and 510 may be disposed only in the PMOS transistor, e.g., in the first region 404. Again, like numerals are used for the various elements that were described in FIGS. 1 through 3, FIGS. 4 through 8, and 9 through 13, and to avoid repetition, each reference number shown in FIGS. 14 and 15 is not described again in detail herein. Rather, similar materials x02, x04, x06, x08, etc . . . are preferably used for the various material layers shown as were described for FIGS. 1 through 3, 4 through 8, and 9 through 13, where x=1 in FIGS. 1 through 3, x=2 in FIGS. 4 through 8, x=3 in FIGS. 9 through 13, x=4 in FIG. 14, and x=5 in FIG. 15.

In the embodiments shown in FIGS. 14 and 15, preferably the first gate dielectric material 412 and 512 comprises a hafnium-based material, and preferably the second gate dielectric material 410 and 510 comprises an aluminum-based material. The second gate dielectric material 410 and 510 preferably is disposed at the top surface of the gate dielectric, abutting the silicon layer 414 and 514. In FIG. 14, after the second gate dielectric material 410 and 510 is formed in the first region 404, the second region 406 is re-filled with the first gate dielectric material 412. Note that in this embodiment, the thicknesses $d_1$ and $d_2$ of the gate dielectrics of both the PMOS ($d_2$) and NMOS ($d_1$) transistor may be the same, as shown, although alternatively, the thicknesses $d_1$ and $d_2$ might not be the same. However, the re-filling step is optional, as shown in FIG. 15, wherein the thickness $d_2$ of the gate dielectric of the PMOS transistor is greater than the thickness $d_3$ of the gate dielectric of the NMOS transistor. In the embodiments shown in FIGS. 14 and 15, the silicon layer 414 and 514 pins the work function of the PMOS transistor to P type, and pins the work function of the NMOS transistor to N type.

The embodiments shown in FIGS. 14 and 15 may be manufactured by, after a pre-gate cleaning step, depositing the first gate dielectric material 412 and 512 comprising a hafnium-based material in a thickness of about 20 Å, and depositing the second gate dielectric material 410 and 510 in a thickness of about 20 Å over the first gate dielectric material 412 and 512. A hard or soft mask is then deposited over the second gate dielectric material 410 and 510, and the mask is used to protect the first region 404 while the second gate dielectric material 410 and 510 is removed from the second region 406. The second gate dielectric material 412 may be refiled e.g., using a spin-on material, or by depositing an excess amount of the second gate dielectric material 412 and removing the excess over the first gate dielectric material 410, as shown in FIG. 14. Alternatively, the second gate dielectric material 512 may not be refiled, as shown in FIG. 15.

The thin silicon layer 414 and 514 is then formed by exposure to a silicon-containing gas, as shown. The gate material 416 and 516 preferably comprising a metal is then deposited over the thin silicon layer 414 and 514, and the material layers are patterned to form the transistor gates (not shown; see the previously described embodiments, e.g., in FIG. 3 or 13.)

The embodiments shown in FIGS. 14 and 15 are advantageous in that the number of lithography masks required to manufacture the devices 400 and 500 is further reduced. Furthermore, the devices 400 and 500 have PMOS transistors and NMOS transistors with a common gate material 416 and 516.

The novel CMOS device of embodiments of the present invention described herein having a PMOS transistor and an NMOS transistor that have gate dielectrics comprising different materials and that have their work functions pinned by the interaction of a thin silicon layer with the underlying gate dielectric material may be manufactured using other methods and processing steps, for example. Rather than attempting to solve problems in the prior art caused by the Fermi-pinning effect, embodiments of the invention utilize the understanding of materials (e.g., Si—Al pins to P type and Si—Hf pins to N type) to intentionally use the Fermi-pinning effect in the design of an improved CMOS device.

Advantages of embodiments of the invention include providing methods of fabricating CMOS devices 100, 200, 300, 400, and 500 and structures thereof, wherein the PMOS transistor and the NMOS transistor have a substantially symmetric $V_t$. For example, $V_{tn}$ may be about +0.2 to +5 V, and $V_{tp}$ may be the substantially the same negative value, e.g., about −0.2 to −5 V. The threshold voltages $V_t$ may alternatively comprise other voltage levels, for example. The threshold voltage $V_t$ is decreased compared to prior art CMOS devices, and the flat band voltage is easier to tune. Embodiments of the invention may utilize high-k dielectric materials as the gate dielectric, and may include metal, polysilicon, or FUSI gate electrodes. The metal gate electrodes may comprise either single metal or dual-work function metals, e.g., the gate electrode for the PMOS and NMOS transistors may be the same material or different materials. Embodiments of the invention utilize the fact that Si—Al pins to p-type and Si—Hf pins to n-type in the PMOS device and NMOS device, respectively, and allow the use of metal electrodes, preventing poly depletion problems that polysilicon gate electrodes can exhibit. The metal gates may comprise TaN or TiN, as examples, which are compatible materials with CMOS processing. Because the silicon layer is thin, the effective oxide thickness of the device is not substantially increased.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:

providing a workpiece, the workpiece comprising a first region and a second region;

forming a first transistor in the first region of the workpiece, the first transistor including a first gate dielectric material;

forming a second transistor in the second region of the workpiece, the second transistor including a second gate dielectric material; and exposing the first gate dielectric material and the second gate dielectric material to a silicon-containing substance to form a first silicon layer over the first gate dielectric material and a second silicon layer over the second gate dielectric material, wherein the first silicon layer and the second silicon layer pin the work function of the first transistor and the second transistor, respectively.

2. The method according to claim 1, wherein forming the second transistor comprises forming a hard mask over the first region of the workpiece, depositing the second gate dielectric material over the hard mask and the second region of the workpiece, depositing a second gate material over the second gate dielectric material, removing the second gate material, second gate dielectric material, and the hard mask from over the first region of the workpiece, leaving the second gate material and the second gate dielectric material residing over the second region of the workpiece, wherein exposing the second gate dielectric material to the silicon-containing substance is after depositing the second gate dielectric material; and wherein forming the first transistor comprises depositing the first gate dielectric material over the first region of the workpiece and over the second gate material over the second region of the workpiece, depositing the first gate material over the first gate dielectric material, and removing the first gate material and the first gate dielectric material from over the second region of the workpiece, leaving the first gate material and the first gate dielectric material over the first region of the workpiece, wherein exposing the first gate dielectric to the silicon-containing substance is after depositing the first gate dielectric material.

3. The method according to claim 2, wherein removing the second gate material, second gate dielectric material, and the hard mask from over the first region of the workpiece comprises depositing a first photoresist over the second gate material, removing the first photoresist from over the first region of the workpiece, removing the second gate material, second gate dielectric material, and the hard mask from the first region using the first photoresist as a mask, and removing the first photoresist; and wherein removing the first gate material and the first gate dielectric material from over the second region of the workpiece comprises depositing a second photoresist over the first gate material, removing the second photoresist from over the second region of the workpiece, removing the first gate material and the first gate dielectric material from the second region using the second photoresist as a mask, and removing the second photoresist.

4. The method according to claim 1, wherein the workpiece has a top surface, wherein forming the first gate dielectric material comprises forming the first gate dielectric material over the entire top surface of the workpiece, further comprising forming a first gate material over the first gate dielectric material, depositing a hard mask over the first gate material, and using the hard mask as a mask while removing the first gate material and the first gate dielectric material from over the second region of the workpiece, further comprising forming the second gate dielectric material over the first gate material in the first region and over the workpiece in the second region, and forming a second gate material over the second gate dielectric material, and removing the second gate material and the second gate dielectric material from over the first gate material.

5. The method according to claim 1, wherein forming the first transistor comprises forming a first transistor having a first gate dielectric material comprising aluminum, wherein forming the first transistor comprises forming a p channel metal oxide semiconductor (PMOS) transistor, and wherein forming the second transistor comprises forming a second transistor having a second gate dielectric material comprising hafnium, wherein forming the second transistor comprises forming an n channel metal oxide semiconductor (NMOS).

6. The method according to claim 1, wherein exposing the first gate dielectric material and the second gate dielectric material to a silicon-containing substance comprises exposing the first gate dielectric material and the second gate dielectric material to $SiH_4$, $SiCl_4$ or $Si[N(CH_3)C_2H_5]_4$.

7. The method according to claim 1, wherein exposing the first gate dielectric material and the second gate dielectric material to a silicon-containing substance comprises forming a first silicon layer over the first gate dielectric material and forming a second silicon layer over the second gate dielectric material.

8. The method according to claim 7, wherein forming the first silicon layer and forming the second silicon layer comprise forming about 1 to 10 monolayers or a sub-monolayer of silicon.

9. The method according to claim 7, wherein forming the first silicon layer and forming the second silicon layer comprise forming a layer having a thickness of about 30 Å or less.

10. The method according to claim 1, further comprising forming a first gate over the first gate dielectric material, and forming a second gate over the second gate dielectric material, wherein the first gate and the second gate comprise a semiconductor material or a metal.

11. The method according to claim 10, wherein forming the first gate and forming the second gate comprise forming TiN, HfN, TaN, ZrN, LaN, TiN, HfN, TaN, RuN, WN, W, TiSiN, HfSiN, TaSiN, ZrSiN, LaSiN, TiSiN, HfSiN, TaSiN, RuSiN, WSiN, WSi, a semiconductive material, or combinations thereof.

12. The method according to claim 10, wherein forming the first gate and forming the second gate comprise forming a gate having a thickness of about 10 Å to about 1000 Å.

13. The method according to claim 10, wherein forming the first gate and the second gate comprise forming a first gate and a second gate comprising the same material, or forming a first gate and a second gate from the same material layer.

14. The method according to claim 1, wherein the first region of the workpiece is proximate the second region of the workpiece, wherein the semiconductor device comprises a complimentary metal oxide semiconductor (CMOS) device, wherein forming the first transistor comprises forming a p channel metal oxide semiconductor transistor (PMOS) device, and wherein forming the second transistor comprises forming an n channel metal oxide semiconductor transistor (NMOS) device, wherein the first transistor and the second transistor comprise substantially symmetric threshold voltages $V_t$.

15. The method according to claim 14, further comprising lightly doping the first region with an N dopant and lightly doping the second region with a P dopant, further comprising forming a first source and a first drain of the first transistor by implanting a P dopant into the first region of the workpiece, and further comprising forming a second source and a second drain of the second transistor by implanting N dopants into the second region of the workpiece.

16. The method according to claim 1, wherein forming the first gate dielectric material comprises forming a first insulating layer over the first region and the second region of the workpiece, and forming a second insulating layer over the first insulating layer over the first region, but not the second region of the workpiece.

17. The method according to claim 16, wherein the first transistor comprises a PMOS transistor and the second transistor comprises an NMOS transistor, wherein forming the first insulating layer comprises depositing a high-k dielectric material, wherein forming the second insulating layer comprises forming an aluminum-containing material, and wherein forming the first gate material comprises depositing the first gate material over and abutting the second insulating layer.

18. The method according to claim 17, wherein forming the first insulating layer comprises forming a hafnium-based layer.

19. The method according to claim 16, further comprising depositing a third insulating layer over the first insulating layer, after forming the second insulating layer.

20. The method according to claim 1, wherein forming the first transistor comprises forming a transistor having a first gate dielectric comprising $Si_3N_4$, $Al_2O_3$, $Ta_2O_5$, $HfO_2$, $TiO_2$, $HfSiO_x$, $ZrO_2$, $ZrSiO_x$, $La_2O_3$, $CeO_2$, $Bi_4Si_2O_{12}$, $WO_3$, $Y_2O_3$, $LaAlO_3$, BST $(Ba_{(a-x)}Sr_xTiO_3)$, PST $(PbSc_xTa_{(1-a)}O_3)$, PZN $(PbZn_xNb_{(1-x)}O_3)$, PZT $(PbZr_xTi_{(1-x)}O_3)$, PMN $(PbMg_xNb_{(1-x)}O_3)$, or combinations thereof, and wherein forming the second transistor comprises forming a transistor having a second gate dielectric comprising $Si_3N_4$, $Al_2O_3$, $Ta_2O_5$, $HfO_2$, $TiO_2$, $HfSiO_x$, $ZrO_2$, $ZrSiO_x$, $La_2O_3$, $CeO_2$, $Bi_4Si_2O_{12}$, $WO_3$, $Y_2O_3$, $LaAlO_3$, BST $(Ba_{(a-x)}Sr_xTiO_3)$, PST $(PbSc_xTa_{(1-a)}O_3)$, PZN $(PbZn_xNb_{(1-x)}O_3)$, PZT $(PbZr_xTi_{(1-x)}O_3)$, PMN $(PbMg_xNb_{(1-x)}O_3)$, or combinations thereof.

21. A method of making a semiconductor device, the method comprising:
forming a first transistor in a first region of a workpiece, the first transistor including a first source and a first drain disposed in the workpiece, a first channel region disposed between the first source and the first drain, a first gate dielectric disposed over the first channel region, the first gate dielectric comprising a first material, a first silicon layer disposed over the first gate dielectric, and a first gate disposed over the first silicon layer; and
forming a second transistor in a second region of the workpiece, the second transistor including a second source and a second drain disposed in the workpiece, a second channel region disposed between the second source and the second drain, a second gate dielectric disposed over the second channel region, the second gate dielectric comprising a second material, a second silicon layer disposed over the second gate dielectric, and a second gate disposed over the second silicon layer, wherein the first transistor comprises a work function that is pinned by the first silicon layer, and wherein the second transistor comprises a work function that is pinned by the second silicon layer.

22. The method according to claim 21, wherein the first silicon layer and the second silicon layer comprise about 1 to 10 monolayers or a sub-monolayer of silicon.

23. The method according to claim 21, wherein the first silicon layer and the second silicon layer comprise a thickness of about 30 Å or less.

24. The method according to claim 21, wherein the first transistor comprises a p channel metal oxide semiconductor (PMOS) transistor and the second transistor comprises an n channel metal oxide semiconductor (NMOS) transistor, wherein the first transistor and the second transistor comprise substantially symmetric threshold voltages $V_t$.

25. The method according to claim 24, wherein the first gate dielectric comprises an aluminum-based material, and wherein the second gate dielectric comprises a hafnium-based material.

26. The method according to claim 21, wherein the first gate dielectric comprises a first insulating layer disposed over the first channel, and a second insulating layer disposed over the first insulating layer, and wherein the second gate dielectric comprises the first insulating layer.

27. The method according to claim 26, wherein the first insulating layer comprises a high-k dielectric material, and wherein the second insulating layer comprises an aluminum-based material, wherein the second insulating layer is disposed beneath and abuts the first gate.

28. The method according to claim 21, wherein the first gate dielectric and the second gate dielectric each have a thickness of about 5 to 60 Angstroms.

29. The method according to claim 21, wherein the first gate dielectric and the second gate dielectric comprise $Si_3N_4$, $Al_2O_3$, $Ta_2O_5$, $HfO_2$, $TiO_2$, $HfSiO_x$, $ZrO_2$, $ZrSiO_x$, $La_2O_3$, $CeO_2$, $Bi_4Si_2O_{12}$, $WO_3$, $Y_2O_3$, $LaAlO_3$, BST $(Ba_{(a-x)}Sr_xTiO_3)$, PST $(PbSc_xTa_{(1-a)}O_3)$, PZN $(PbZn_xNb_{(1-x)}O_3)$, PZT $(PbZr_xTi_{(1-x)}O_3)$, PMN $(PbMg_xNb_{(1-x)}O_3)$, or combinations thereof.

30. The method according to claim 21, wherein the first gate and the second gate comprise TiN, HfN, TaN, ZrN, LaN, TiN, HfN, TaN, RuN, WN, W, TiSiN, HfSiN, TaSiN, ZrSiN, LaSiN, TiSiN, HfSiN, TaSiN, RuSiN, WSiN, WSi, a semiconductive material, or combinations thereof.

31. The method according to claim 21, wherein the first gate and the second gate each have a thickness of about 10 Å to about 1000 Å.

32. The method according to claim 21, wherein the first gate and the second gate comprise the same material.

33. The method of claim 19, wherein the first insulating layer and the third insulating layer comprise the same material.

\* \* \* \* \*